United States Patent [19]

Morrison

[11] Patent Number: 4,861,416
[45] Date of Patent: Aug. 29, 1989

[54] RIBBON GROWING METHOD AND APPARATUS

[75] Inventor: Andrew D. Morrison, Altadena, Calif.

[73] Assignee: The United States of America as represented by the Administrator, National Aeronautics and Space Administration, Washington, D.C.

[21] Appl. No.: 718,798

[22] Filed: Apr. 4, 1985

[51] Int. Cl.⁴ .............................................. C30B 9/06
[52] U.S. Cl. ................................. 156/608; 156/617.1; 156/620.1; 156/DIG. 64; 156/DIG. 84; 156/DIG. 89; 118/405; 118/407; 118/419; 118/428; 118/429; 422/249; 427/80
[58] Field of Search ............... 118/404, 405, 407, 419, 118/428, 429; 156/608, 617 R, DIG. 64, DIG. 84, DIG. 89, 620.1; 422/246-249; 427/80

[56] References Cited

U.S. PATENT DOCUMENTS 4,046,954 9/1977 Ehman et al. ................. 156/600 X
4,269,652 5/1981 Yancey .......................... 156/608 X
4,520,752 6/1985 Belouet ......................... 118/419 X

FOREIGN PATENT DOCUMENTS 2067920 8/1981 United Kingdom .

Primary Examiner—Barry S. Richman
Assistant Examiner—Timothy M. McMahon
Attorney, Agent, or Firm—Thomas H. Jones; John R. Manning; Charles E. B. Glenn

[57] ABSTRACT

A method and apparatus are described which facilitate the growing of silicon ribbon. A container for molten silicon has a pair of passages in its bottom through which filaments extend to a level above the molten silicon, so as the filaments are pulled up they drag up molten silicon to form a ribbon. A pair of guides surround the filaments along most of the height of the molten silicon, so that the filament contacts only the upper portion of the melt. This permits a filament to be used which tends to contaminate the melt if it is in long term contact with the melt. This arrangement also enables a higher melt to be used without danger that the molten silicon will run out of any bottom hole.

12 Claims, 2 Drawing Sheets

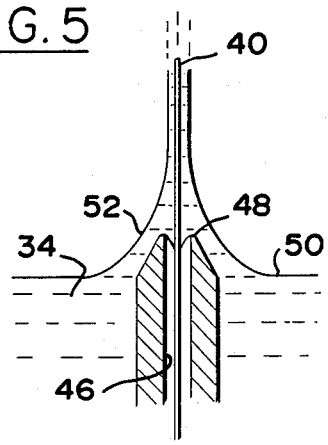
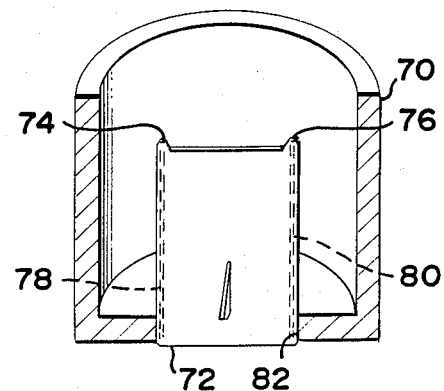
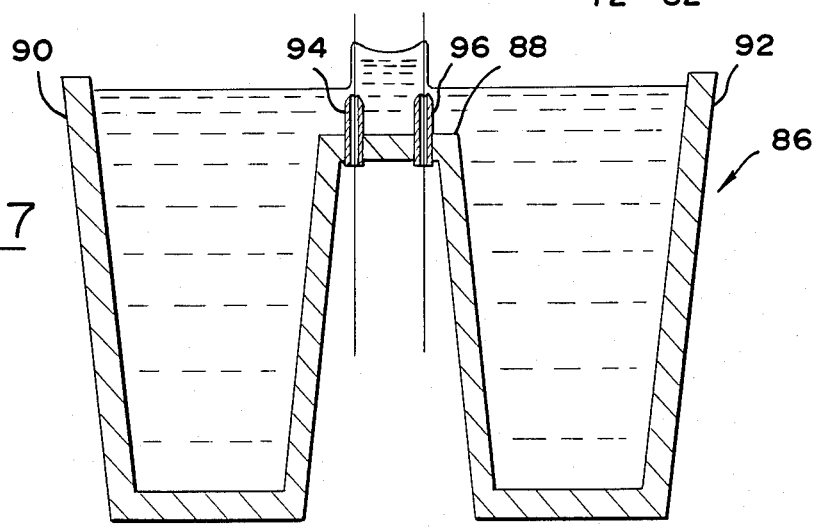
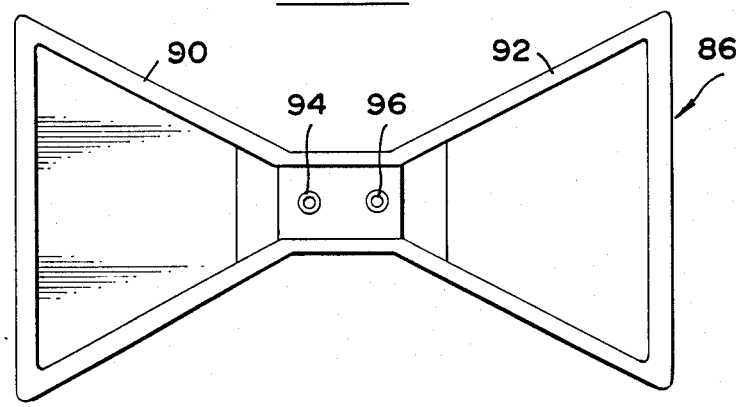

RIBBON GROWING METHOD AND APPARATUS

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

Ribbons of silicon that are useful in applications such as the construction of solar cells, can be constructed by edge supported growth. In such ribbon growth, a pair of filaments pass vertically through holes in the bottom of a container and through a molten bath or melt of silicon in the container. As the filaments are slowly pulled upwardly, silicon is drawn out of the melt to form a ribbon whose edges are defined by the filaments.

A major problem in the use of the edge-supported process for the growth of silicon ribbon, is that it is difficult to find filaments which have substantially the same thermal expansion coefficient as the ribbon of silicon, so as to grow ribbons with little residual stress. A compound that has been developed for use as a substrate in the SOC (silicon on ceramic) process is mullite ($3Al_2O_3.2SiO_2$) which has a thermal expansion coefficient substantially the same as that of silicon. Unfortunately, this material can contaminate a silicon melt, as where a filament extends through the height of a typical prior art melt having a height on the order of a centimeter and a temperature of about 1415° C. and the filament is pulled up at a rate such as 2 centimeters per minute. If a system and method could be developed which permitted the use of such a filament material so that it grew a ribbon of silicon but had minimal contact with the silicon melt, then this would facilitate the growing of silicon ribbon that was substantially free of stresses.

Another problem that has arisen in edge-supported silicon ribbon growth, is that the height of the melt has been severely limited, as to a height of about 1 centimeter. If the height of the melt increased greatly beyond this, then there was danger that the weight of the silicon tending to cause it to drip through the filament-holes in the bottom of the container, would exceed the resistance to such leakage by the surface tension of the silicon. It is important that the temperature of the silicon melt be maintained constant, which would be aided if a melt of considerable height could be used. A system and method which permitted a melt of considerable height to be used would also aid in conducting the process of edge-supported silicon ribbon growth.

SUMMARY OF THE INVENTION

In accordance with one embodiment of the present invention, a method and apparatus are provided which facilitate edge-supported ribbon growth. A pair of filament guides extend up from the bottom of the container which holds the silicon melt, up to a level above the bottom wall of the container and preferably near the surface of the melt. A filament can be used which would otherwise be undesirable because it tends to contaminate a melt with which it is in considerable contact. Such a filament can be used here, because of the fact that the filament is in contact with only the upper portion of the melt that is being drawn off and cooled. The guides also permit a melt of considerable height to be used which promotes thermal stability, since there is not a large depth of melt above the holes at the top of the guides through which silicon could leak out.

Although particular embodiments of the invention have been described and illustrated herein, it is recognized that modifications and variations may readily occur to those skilled in the art. Consequently, it is intended that the claims be interpreted to cover such modifications and equivalents.

BRIEF DESCRIPTION OF THE DRAWINGS

FIG. 5 is a partial sectional view of the apparatus of FIG. 2, but with the top of the melt slightly higher.

FIG. 6 is a partial perspective and sectional view of a ribbon growing apparatus constructed in accordance with another embodiment of the invention.

FIG. 7 is a sectional view of another ribbon growing apparatus.

FIG. 8 is a plan view of the apparatus of FIG. 7.

DESCRIPTION OF THE PREFERRED EMBODIMENT

Figure 1:
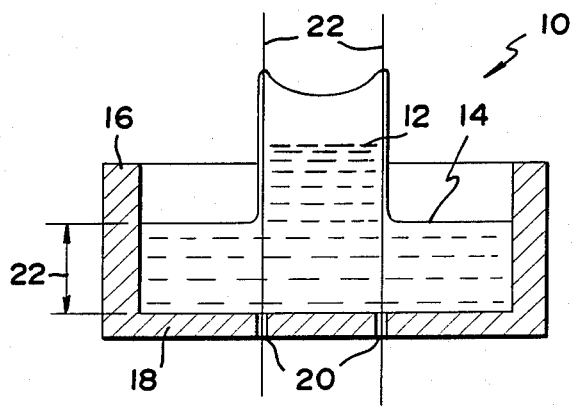
FIG. 1 is a sectional view of a prior art ribbon growing apparatus.

FIG. 1 illustrates a prior art apparatus 10 for growing a ribbon 12 of silicon from a melt 14 of ribbon-growth material. The melt lay in a vat or container 16 with a bottom wall 18 that had a pair of holes 20. A pair of filaments 22 such as of carbon, were drawn up through the holes 20 and the melt 14, to draw molten silicon up into the form of a ribbon. The molten silicon 14 is at a temperature of about 1415° C. and the filaments 22 were pulled upwardly at a rate such as two centimeters per minute to grow the ribbon.

One problem encountered with such prior art apparatus was that the height 22 of the melt had to be maintained at a height no more than about 1 centimeter, in order to prevent molten silicon from leaking out through the holes 20. The holes 20 each had a diameter of about 1 millimeter to easily pass filaments therethrough. It would be desirable to have a taller melt, in order to provide a greater mass of molten material to provide greater stability in the temperature of the melt. Another disadvantage was that the carbon filaments 22 have a coefficient of expansion which is appreciably different than that of silicon, so as the silicon cooled to a temperature at which it solidified, along with the filaments, residual stress was created in the ribbon, which reduced its reliability. Quartz fibers have also been used, but they are an even worse match to the silicon.

A material known as mullite (composed of $3Al_2O_3.2SiO_2$) has been developed for use for siliconon-ceramic processes, which has a thermal coefficient of expansion that closely matches that of silicon. However, filaments of mullite have a serious disadvantage in that they contaminate a silicon melt with which they are in contact, the amount of contamination depending upon the area of contact and the period of contact. The contact of filaments to grow a ribbon long enough to make the process economical, would seriously contaminate the melt.

Figure 2:
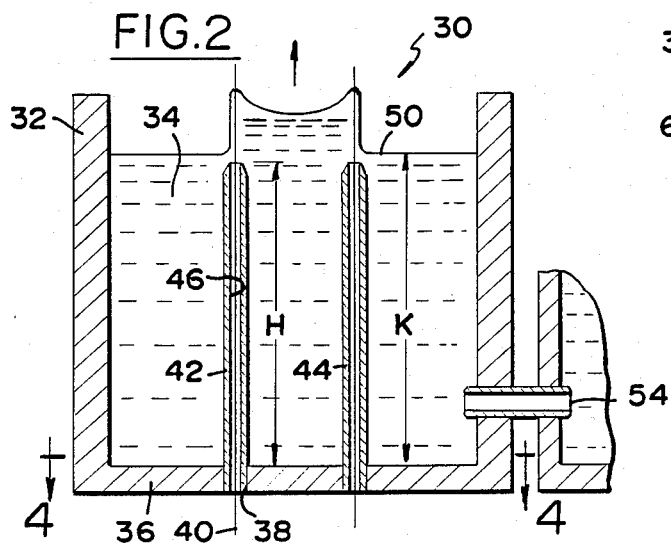
FIG. 2 is a sectional view of a ribbon growing apparatus constructed in accordance with one embodiment of the present invention.

FIG. 2 illustrates apparatus 30 of the present invention, which overcomes important disadvantages of the prior art. The apparatus includes a container 32 for holding a heated ribbon-growable material or melt 34, especially of a semiconductor such as silicon (or germanium). The container has a bottom wall 36 with a pair of spaced holes 38 through which filaments 40 extend. The container also includes a pair of guides 42, 44, which are shown as in the form of tubes that form passages 46 aligned with the container holes 38, that extend through the bottom wall of the container and which guide the filaments 40. The guides 42, 44 each extend to a height considerably above the bottom wall, to isolate filaments inside the passages from the melt material which lies along the height H of the passages above the bottom wall. The diameter of the passages 46 is on the order of one millimeter, and the height H of the guides above the bottom wall of the container, and of the melt, is preferably at least 2 centimeters.

As shown in FIG. 5, the extreme upper tip 48 of the walls of the guide can lie above the top surface 50 of the melt (although it can lie somewhat below the surface also). Prior to drawing up the filament 40, the filament is wetted with the silicon, as by spreading a small quantity of the melt against the filament to form a miniscus 52 at each filament. When the filament is then drawn upwardly, it draws molten silicon up with it to form a ribbon. Since the ribbon will cool and become hardened at a location above the top of the melt surface 50, the filament 40 will be in contact with molten silicon for only a limited height, and even along that height the silicon will be at a progressively lower temperature. As a result, where a filament 40 of mullite or other material which easily contaminates the melt, is used, the contamination of the entire melt 34 will be minimal, and the contamination of the portion of the silicon in the ribbon will be reduced to a small amount due to the limited distance along which the filament is in contact with silicon which is hot enough to be easily contaminated.

The height of the top 48 of the guides above the surface 50 of the melt is preferably less than 1 centimeter, in as much as the miniscus 52 of molten silicon cannot reach up more than about a centimeter (at the viscosity of the typical molten temperature of 1415° C. of the silicon). The height of the top 48 of the guide can be below the surface 50 of the melt, especially where the filament is of a material that does not contaminate the melt, although it should not be more than about 1 centimeter below the surface 50 of the melt or else there is increasing danger that the molten silicon will leak through the passages 46. The height K (FIG. 2) of the melt can be as high as is convenient, and may be about as high as it is wide, to produce a massive molten silicon that has minimal surface area for a given volume. The top of the guides should be closer to the surface 50 of the silicon then to the bottom of the melt. The guides will be a plurality of millimeters above the bottom of the melt and the bottom of the inside of the container. The upper ends of the guides lie at about the same level as the top of the mass of molten silicon; that is the upper ends of the guides lie within about 5 millimeters of the top of the molten silicon.

It may be noted that as the filaments 40 are pulled upwardly, the height of the surface 50 will decrease unless measures are taken to restore the height. Additional silicon at the same temperature as that of the melt 34 is introduced to the melt through a tube 54. The tube 54 is connected to an auxiliary container 55 of molten silicon. The fact that the height of the melt is considerable, instead of being severely limited as in FIG. 1, results in a greater mass that minimizes the variation in temperature of the molten mass when the new molten silicon is introduced into the container.

Figure 3:
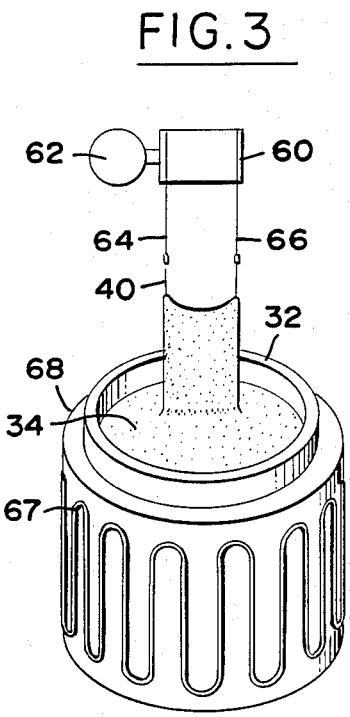
FIG. 3 is a perspective view of the apparatus of FIG. 2.
Figure 4:
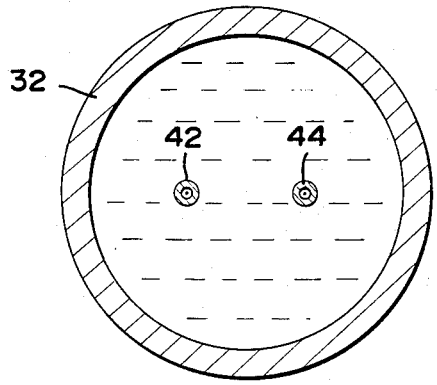
FIG. 4 is a view taken on the line 4—4 of FIG. 2.

FIG. 3 shows the apparatus, including a wind-up reel 60 operated by a gear head motor 62 to slowly raise a pair of lines 64, 66 whose lower ends are connected to the filaments 40. This figure also shows a heat source 67 formed by a resistance heating coil which surrounds a suseptor container 68 of graphite to maintain the container or crucible 32 formed of quartz at a constant temperature of 1415° C. f the melt.

FIG. 6 illustrates a portion of a container 70 and a guide means 72 in the form of a single structure, which has walls 74, 76 that form a pair of passages 78, 80 that can guide filaments. The guide means lies in a hole 82 in the bottom of the container. This construction is similar to that of FIG. 2 except that the walls forming the passages are somewhat more stable in position.

FIG. 7 illustrates another apparatus 86 which includes a relatively shallow tray 88 connected to each of a pair of deeper containers 90, 92 over most of the height of the tray. The use of a relatively shallow tray results in reducing temperature fluctuations near the tops of the filament guides 94, 96 that are caused by gravity driven convection. Instead, such convection currents are confined to the deep containers. The fact that molten material in the tray 88 is connected to molten material in the deep containers results in maintenance of a relatively constant temperature and melt level at the tops of the guides.

Thus, the invention provides an edge-supported silicon ribbon growing method and apparatus, which permits the portion of the filaments that contact molten material to extend through a minimal height of molten silicon. This is accomplished by the use of guides for the filaments that extend to a level above the bottom of the container and of the melt therein. A filament having a thermal coefficient of expansion similar to that of the melt material, such as silicon, but which tends to contaminate the melt, can be used by establishing the top of the guides near the top of the melt. By having the top of the guides near the top of the melt, the height of the melt is not restricted, and therefore a melt of considerable height can be used to provide considerable thermal stability to the melt.

The novel features that are considered characteristic of this invention are set forth with particularity in the appended claims. The invention will best be understood from the following description when read in connection with the accompanying drawings.

What is claimed is:

1. An apparatus for growing a ribbon of material, comprising:
    walls forming a container for holding heated ribbon-growable material, said container having a bottom wall and at least one hole extending through said bottom wall to pass filaments therethrough;
    means for drawing a pair of filaments up through said holes and above said container to form a ribbon of said material between the filaments;
    said container including a pair of guides having upper ends and forming passages aligned with said at least one hole, said guides extending to a height above said bottom wall to isolate filaments inside said passages from the rest of the inside of the container below said height.

2. The apparatus described in claim 1 wherein:
said passages in said guides have a diameter on the order of a millimeter and said guides extend to a height of at least 2 centimeters above the bottom wall of said container.

3. The apparatus described in claim 1 including:
a mass of silicon at a molten temperature of about 1415° C. lying in said container;
a pair of filaments, each of a material which has substantially the same coefficient of expansion as silicon, but wherein the filament material is capable of contaminating molten silicon when in contact with it;
the upper ends of said guides lying at about the same level as the top of the mass of molten silicon, whereby the filaments contact only the top of the mass of molten silicon to minimize the contamination.

4. The apparatus described in claim 1 wherein:
a second container that is deeper than said first mentioned container, the insides of said containers being exposed to each other along most of the height of said first container, whereby to isolate the upper ends of said guides from gravity driven convection currents.

5. In apparatus for growing a ribbon of semiconductor material, which includes a container holding a melt of molten semiconductor material, the container having a pair of spaced passages extending through its bottom wall, and apparatus which draws a pair of filaments up through the passages and the melt to grow a ribbon of the semiconductor material between the filaments, the improvement wherein:
said container includes guide means forming walls that extend said passages to about the same height as the top of the melt and that isolate the inside of the passages and the lengths of filaments therein from the melt up to substantially the top of the guide means.

6. The improvement described in claim 5 wherein:
the height of said guide means is within 5 millimeters of the top of said melt.

7. The improvement described in claim 5 wherein:
said melt consists of silicon at about 1415° C., and the height of said melt is at least 2 centimeters, and said guides extend along most of the height of the melt.

8. The improvement described in claim 5 wherein:
the tops of said passages lie above the top of said melt.

9. The improvement described in claim 5 including:
a pair of filaments extending through said passages and in contact with only the to of said melt;
said semiconductor material is silicon at a temperature of about 1415° C., and said filaments are composed of the following compound: $3A_2O_3.2SiO_2$.

10. A method for growing silicon ribbon comprising:
pulling a pair of filaments upwardly through a pair of passages that have walls largely surrounded by a mass of molten silicon and that have upper ends lying above the bottom of the mass of silicon, establishing contact between only the top of the mass of molten material and the filaments, and drawing up material from the mass.

11. The method described in claim 10 wherein:
said mass is at a temperature of about 1415° C. and a depth of at least 2 centimeters.

12. The method described in claim 11 wherein:
said step of pulling a pair of filaments includes pulling filaments of a material which has about the same temperature coefficient of expansion of silicon but which tends to contaminate it; and including
maintaining the height of said mass so its upper surface lies within about 5 millimeters of the extreme top of the walls of said passages.

* * * * *

UNITED STATES PATENT AND TRADEMARK OFFICE
CERTIFICATE OF CORRECTION

PATENT NO. : 4,861,416

DATED : August 29, 1989

INVENTOR(S) : Andrew D. Morrison

It is certified that error appears in the above-identified patent and that said Letters Patent is hereby corrected as shown below:

On the title page, item [21], Application Number should read --719,798--.

Signed and Sealed this

Fourteenth Day of December, 1993

Attest:

BRUCE LEHMAN

*Attesting Officer*    *Commissioner of Patents and Trademarks*